(12) United States Patent
Roth et al.

(10) Patent No.: US 6,519,305 B1
(45) Date of Patent: Feb. 11, 2003

(54) FREQUENCY CONVERTER ARRANGEMENT

(75) Inventors: Alexander Roth, Dorfen (DE); Klaus Danzeisen, Graefelfing (DE)

(73) Assignee: Rohde & Scwarz GmbH & Co. KG, München (DE)

( * ) Notice: Subject to any disclaimer, the term of this patent is extended or adjusted under 35 U.S.C. 154(b) by 0 days.

(21) Appl. No.: 09/301,412

(22) Filed: Apr. 28, 1999

(30) Foreign Application Priority Data

Apr. 28, 1998 (DE) .......................................... 198 19 038

(51) Int. Cl.[7] .................................................. H03D 3/24
(52) U.S. Cl. .................... 375/376; 375/375; 455/180.3; 455/189.1
(58) Field of Search .................................. 375/327, 376, 375/375, 373; 331/18; 327/156, 159, 162, 163; 455/151.3, 173.1, 180.3, 189.1, 260, 183.1, 183.2, 315, 316; 342/103

(56) References Cited

U.S. PATENT DOCUMENTS 4,152,669 A * 5/1979 Igarashi ........................ 331/16
5,349,310 A * 9/1994 Rieder et al. .................. 331/18

FOREIGN PATENT DOCUMENTS

DE 27 44 432 C2 7/1978
DE 40 21 294 A1 9/1992

OTHER PUBLICATIONS

Patent Abstracts of Japan, vol. 9, No. 14 (E–323), Jun. 21, 1985 & JP60–28330 (Hitachi Seisakusho K.K.) Mar. 13, 1985.
Patent Abstracts of Japan, vol. 11, No. 104 (E–494) Apr. 2, 1987 JP61–252720(Hitach Ltd.) Nov. 10, 1986.

* cited by examiner

*Primary Examiner*—Phuong Phu
(74) *Attorney, Agent, or Firm*—Schiff Hardin & Waite

(57) ABSTRACT

A frequency arrangement with at least two successive heterodyne stages, one of which converts an input signal with an adjustable first frequency of a superposition oscillator that can be set in fine frequency increments into a first intermediate frequency, a second heterodyne stage that converts an input signal with a fixed second heterodyne frequency of a second superposition oscillator into a second intermediate frequency, the difference frequency between the first and second heterodyne frequencies is converted with an adjustable frequency divider into a lower frequency, which is then compared in a phase detector to the output frequency of a reference oscillator which is implemented as a synthesizer that can be set in fine frequency increments, the first superposition oscillator being synchronized with the output frequency of the reference oscillator via a phase control loop with the output signal of this phase detector, and the adjustable frequency divider preferably being a fractional N-divider with single stage integration.

5 Claims, 2 Drawing Sheets

FREQUENCY CONVERTER ARRANGEMENT

BACKGROUND OF THE INVENTION

The invention relates to frequency converters. More particularly, the invention relates to a frequency converter arrangement with at least two successive heterodyne stages, a first heterodyne stage which converts an input signal with an adjustable first heterodyne frequency of a first superposition oscillator, and a second heterodyne stage which converts an input signal with a fixed second heterodyne frequency of a second superposition oscillator into a second intermediate frequency.

Frequency arrangements of this type are known; see, e.g., German patent documents Nos. DE 27 44 432 and DE 40 21 294 and Japanese Patent Abstracts 60-28330A and 61-252720A. In such arrangements, a frequency divider which can be set in integral division ratios is used as frequency divider. The reference oscillator is an oscillator that is tuned to a fixed frequency. The phase comparison takes place at a frequency that is obtained by dividing the frequency of the reference oscillator. This frequency determines the step width with which the receive frequency can be shifted. To achieve a step width of 25 kHz, for example, just such a reference frequency is required. Due to this low reference frequency, the multiplication factor is large and the maximum possible control bandwidth is small, which leads to relatively bad phase noise and high transient recovery times in the frequency change. Thus, these known arrangements are not suitable for frequency conversion arrangements in receivers or spectrum analyzers with a frequency resolution in the Hz range.

The state of the art in these devices involves the mixing of the first local oscillator with the harmonic of a good frequency reference and the synchronizing of the mixed signal with a synthesizer signal. Due to the independent synchronization of the first and second local oscillators, the phase noise of these two oscillators is added, whereby the first oscillator dominates, since it has the higher frequency and is tuned via a synthesizer. The difference of the phase noise between the highest receive frequency and a receive frequency near zero is approximately 6 dB, since the first local oscillator is typically tuned over an octave and the phase noise is determined by the multiplication factor to the reference. This is not sufficient for applications in the receive range of up to several GHz; a phase noise is expected which is proportional to the receive frequency.

The same is true for signal generators in which the output frequency is generated in two successive heterodyne stages with a fixed, or respectively, a variable heterodyne frequency (or: beat frequency), as is the case in modulable signal generators.

SUMMARY OF THE INVENTION

It is an object of the invention to provide a frequency conversion arrangement which is suitable for a receiver, spectrum analyzers, or respectively, signal generators and which has minimal phase noise even at high frequencies.

To that end, in an embodiment the invention provides a frequency conversion arrangement with at least two successive heterodyne stages, the first heterodyne stage which converts an input signal with an adjustable first heterodyne frequency of a first superposition oscillator, which can be set in fine frequency increments, into a first intermediate frequency, and a second heterodyne stage which converts an input signal with a fixed second heterodyne frequency of a second superposition oscillator into a second intermediate frequency, the difference frequency between the first and second heterodyne frequencies being converted with an adjustable frequency divider into a lower frequency, which is compared in a phase detector to the output frequency of a reference oscillator, and the first superposition oscillator being synchronized with the output frequency of the reference oscillator via a phase control loop with the output signal of this phase detector, characterized in that the reference oscillator is a synthesizer that can be set in fine frequency increments.

In an embodiment, the invention provides a frequency conversion arrangement characterized in that the adjustable frequency divider is a fractional N-divider.

In an embodiment, the invention provides a frequency conversion arrangement characterized by its application in a high-frequency receiver or spectrum analyzer, whereby, in a first heterodyne stage (superposition oscillator) with a heterodyne frequency that can be set in fine frequency increments, the input signal to be received is converted into a first constant intermediate frequency, which is subsequently converted with a fixed second heterodyne stage (heterodyne frequency) into a lower second intermediate frequency.

In an embodiment, the invention provides a frequency conversion arrangement characterized by its application in a high-frequency receiver or spectrum analyzer, whereby, in a first heterodyne stage (superposition oscillator) with a heterodyne frequency that can be set in fine frequency increments, the input signal to be received is converted into a first constant intermediate frequency, which is subsequently converted with a fixed second heterodyne stage (heterodyne frequency) into a lower second intermediate frequency.

In accordance with the invention, a synthesizer which can be set in fine frequency increments is used instead of a reference oscillator with a fixed frequency. The reference frequency which is fed to the phase detector can thus be so set that the difference between the reference signal and the signal generated by the frequency divider has minimal noise.

It has proven particularly advantageous to implement the frequency divider as a fractional N-divider with single stage integration, because the division ratio of the frequency divider can thus be set to a minimal division factor and thus to minimal noise. A frequency conversion arrangement is thus inventively created which has minimal phase noise.

It is also conceivable to control to the sum frequency of the two superposition oscillators (or: harmonic oscillators) instead of to the difference frequency, according to how the frequency positions of the frequency conversions are intended.

The same principle can be applied both in a receiver or spectrum analyzer and in a high-frequency generator. In both cases, the sum of the phase noise is appreciably improved compared to conventional frequency conversion concepts. For example, given small receive frequencies, the phase noise is about 20 dB better than in a known arrangement; in the highest receive frequency, up to 6 dB better.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1:
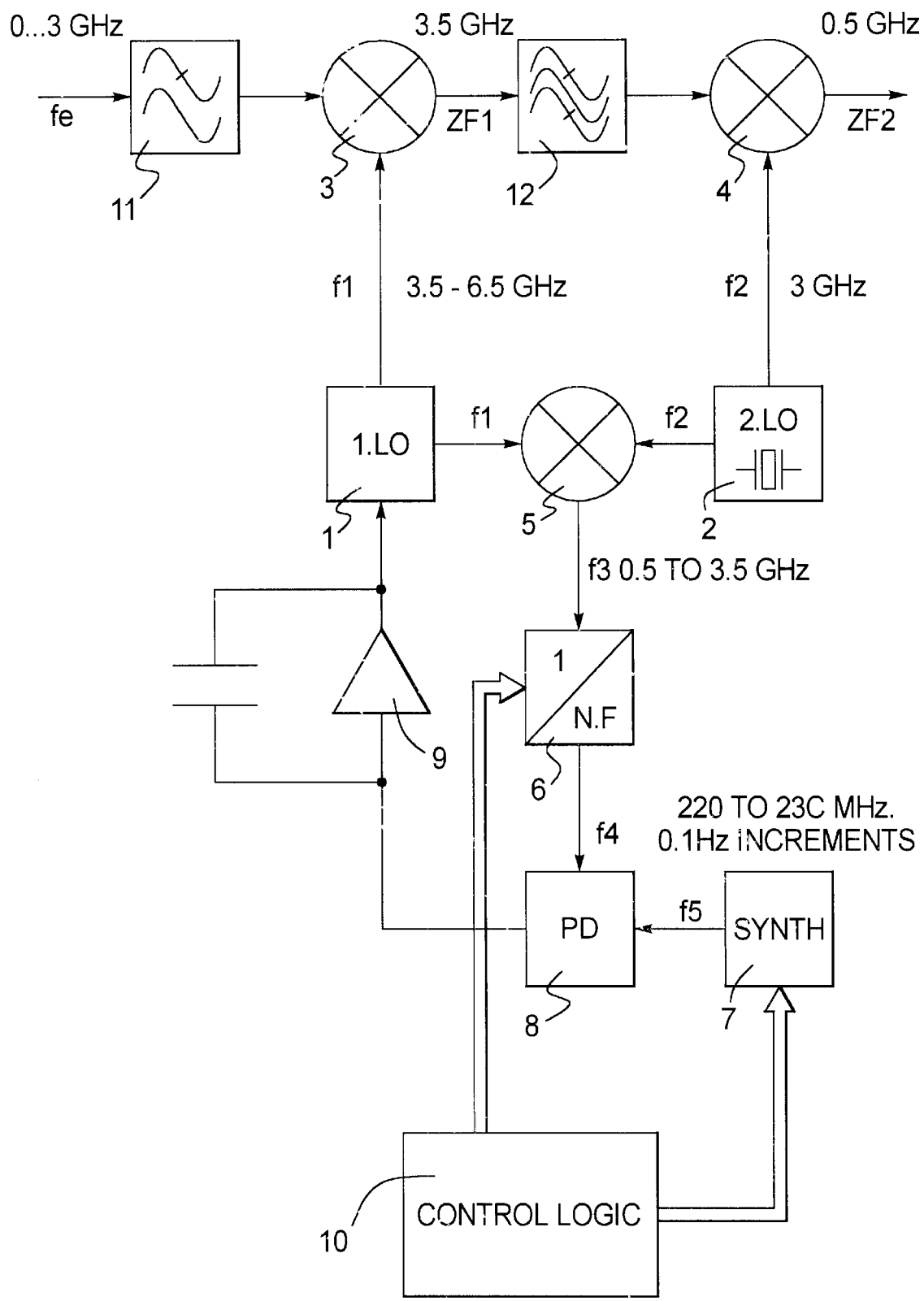
FIG. 1 illustrates the incorporation of principles of the invention in a spectrum analyzer.

FIG. 1 depicts the application of the inventive principle in a spectrum analyzer, in which, subsequent to passing through a low-pass filter 11, an input frequency $f_e$ is converted into a fixed intermediate frequency ZF1 in a first mixer 3 with an adjustable first heterodyne frequency f1, which intermediate frequency ZF1 is converted into a lower second intermediate frequency ZF2 in a second mixer 4 with a fixed second heterodyne frequency f2, subsequent to passing through a bandpass filter 12. Corresponding concrete frequency values in the GHz range are illustrated in FIG. 1.

The first heterodyne frequency f1 is generated in a first superposition oscillator 1; the second heterodyne frequency f2 is generated in a second superposition oscillator 2. The second superposition oscillator 2 is synchronized with a highly stable quartz frequency via a simple control loop. The first superposition oscillator 1 is synchronized with the frequency f5 of a synthesizer 7 via a phase control set, which synthesizer functions according to the known principle of direct digital synthesis (DDS) or fractional N-synthesis. In a mixer 5, the difference frequency f3 is formed from the two heterodyne frequencies f1 and f2 and is fed as divided frequency f4 to the phase detector 8 of the phase control loop for the oscillator 1 via an adjustable frequency divider 6. The frequency divider 6, which is adjustable with respect to a division ratio, is preferably a fractional N-frequency divider, the division ratio of which can be set by conversion to a fractional rational division ratio N.F, with N being the whole-number portion and F being a decimal portion. This fractional division ratio can be set as a digital value via an adjusting device 10. In addition, the synthesizer 7 can be set in its output frequency f5 via this setting means 10 in small increments of 1 Hz or less, e.g. only 0.1 Hz Via a control loop filter 9, the output signal of the phase detector 8 synchronizes the first superposition oscillator 1 with the frequency f5, which is set at the synthesizer 7, which frequency is compared to the divided difference frequency f4 in the phase detector.

The fractional N-divider has a resolution of 1/16, for example, and operates with single stage integration. Its division ratio is set such that the frequency f4 lies approximately in the frequency region in which the synthesizer 7 with its output frequency f5 can be set. In the illustrated exemplifying embodiment, the synthesizer can be adjusted in 0.1 Hz increments only in a narrow frequency range of 10 MHZ between 220 and 230 MHZ. The division factor N. F is selected as follows and set by the setting device 10:

$$N.F = \frac{f1}{f5}$$

Since the division factor N. F cannot be precisely set, it must be rounded as specified by the setting tolerance of the divider. The actual setting of the synthesizer 7 can then be calculated from this actually set division factor:

$$f5 = \frac{f1}{N.F}$$

The first superposition oscillator is thus so controlled by the phase comparison between the output signal of the synthesizer and the divided difference frequency that the difference of the two signals has minimal noise.

Figure 2:
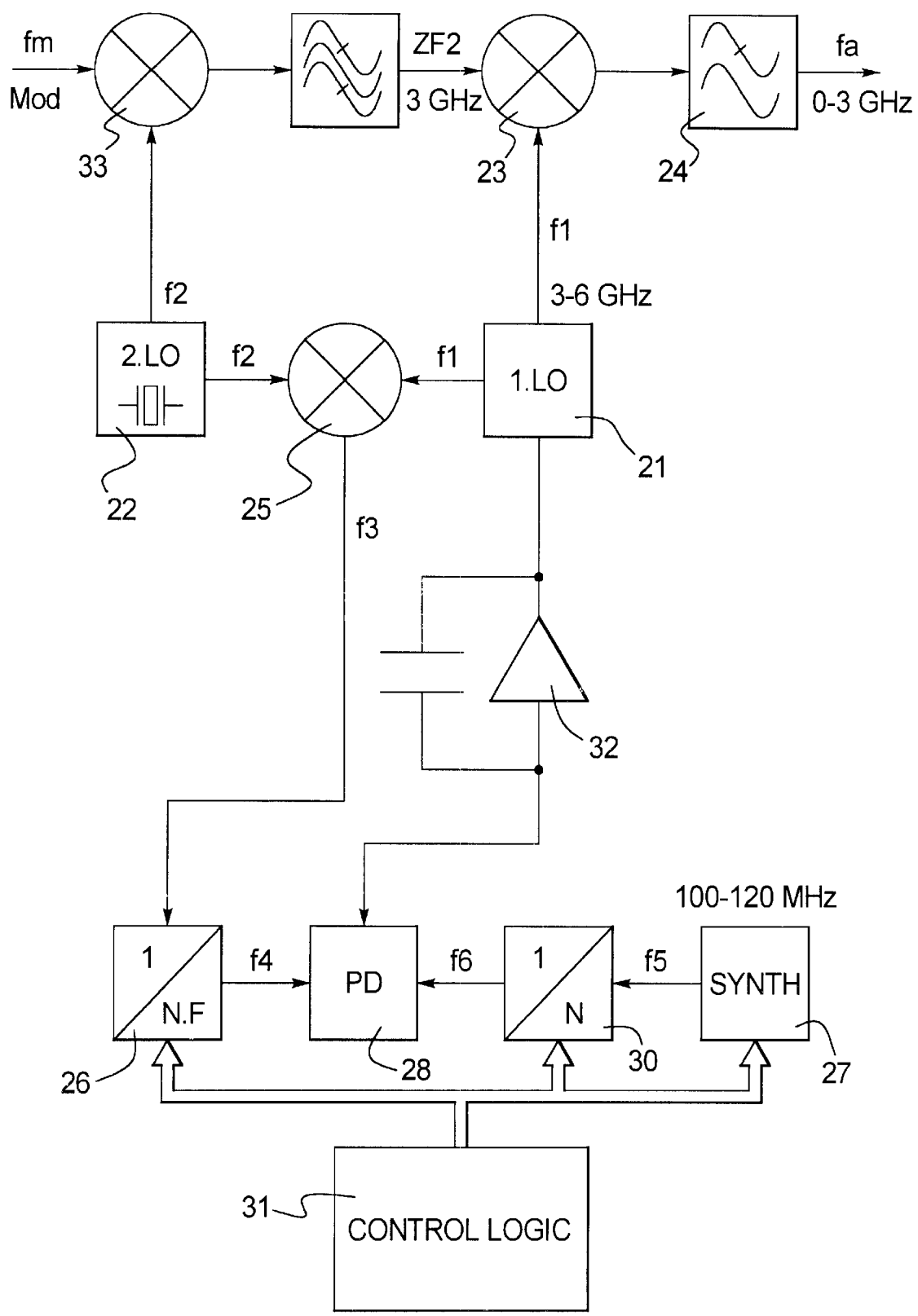
FIG. 2 illustrates the incorporation of principles of the invention in a signal generator.

FIG. 2 illustrates the application of the inventive principles in a signal generator that can be modulated with a modulation frequency $f_m$. Here, the second superposition oscillator 22 with its fixed heterodyne frequency f2 serves for the generation of a fixed modulated intermediate frequency ZF2, which is subsequently converted to the desired output frequency $f_a$ in a second mixer 23 with the adjustable heterodyne frequency f1 of a first superposition oscillator 21, which can be set in small frequency increments. In FIG. 2, a mixer 33 is provided for the generation of the first intermediate frequency ZF2, though in practice, the modulation with the frequency $f_m$ preferably occurs directly by the corresponding controlling of the voltage-controlled second superposition oscillator 22, making a separate mixer 33 superfluous.

In a mixer 25, the difference frequency f3 is again formed from the two superposition frequencies f1 and f2, which, subsequent to division in an adjustable fractional N-divider 26, is compared in a phase detector 28, as frequency f4, to the output frequency of a synthesizer 27, which can be set in small frequency increments.

In FIG. 2, the output frequency f5 of the synthesizer 27 is still fed to the phase detector 28 via an intermediately connected frequency divider 30. This frequency divider 30 can be set to integral division ratios N via the control logic 31. The control logic 31 can also be used to control the fractional N-divider 26, the N-divider and the synthesizer 27.

For higher frequencies (e.g. above 500 MHZ), the frequency divider is set to the division factor N=1; i.e., the superposition oscillator 21 is synchronized, via the loop filter 32, with the frequency f5 that is set at the synthesizer 27, in the manner described in connection with FIG. 1. In order to be able to apply the inventive principle even at lower frequencies below 500 MHZ, the frequency divider 30 can be set via the control logic 31 below 500 MHZ, for example, to such a division value N that the divided output frequency f6 is approximately one-quarter of the output frequency $f_a$. In addition, for lower frequencies the fractional N-divider 26 can again be so controlled via the control logic 31 that the output frequency f4 again lies in the frequency region of f6, and for lower frequencies, the first superposition oscillator 21 is additionally synchronized with the frequency that is set at the synthesizer 27.

Although modifications and changes may be suggested by those skilled in the art, it is the intention of the inventors to embody within the patent warranted hereon all changes and modifications as reasonably and properly come within the scope of their contribution to the art.

What is claimed is:

1. A frequency conversion arrangement, comprising:
   at least first and second successive heterodyne stages;
   the first heterodyne stage converting an input signal into a first intermediate frequency by use of an adjustable first heterodyne frequency of a first superposition oscillator set in fine frequency increments of less than 1 KHZ;
   the second heterodyne stage converting an input signal comprising said first intermediate frequency into a second intermediate frequency by use of a fixed second heterodyne frequency of a second superposition oscillator;
   an adjustable frequency divider converting a difference frequency between the first and second heterodyne frequencies into a lower divided frequency which is compared in a phase detector in a phase control loop to an output frequency of a reference oscillator so as to create an output signal of the phase detector;

said first superposition oscillator being synchronized with said reference oscillator output frequency by use of said phase detector output signal; and said reference oscillator comprising a synthesizer set in fine frequency increments.

2. The frequency conversion arrangement according to claim 1 wherein said adjustable frequency divider comprises a fractional N-divider with single stage integration.

3. The frequency conversion arrangement according to claim 1 wherein a control logic is provided having control outputs connected to both said synthesizer and said adjustable frequency divider, the control logic setting a division ratio of the adjustable frequency divider and a frequency of the synthesizer.

4. The frequency conversion arrangement according to claim 1 wherein a low pass filter is provided at an input to said first heterodyne stage and a band pass filter is provided between said first heterodyne stage and said second heterodyne stage.

5. The frequency conversion arrangement according to claim 1 wherein a control loop filter is provided supplying said output signal from said phase detector to said first superposition oscillator.

* * * * *